United States Patent
Ni et al.

(10) Patent No.: US 7,768,789 B2
(45) Date of Patent: *Aug. 3, 2010

(54) HARD DRIVE WITH METAL CASING AND GROUND PIN STANDOFF TO REDUCE ESD DAMAGE TO STACKED PCBA'S

(75) Inventors: Jim Chin-Nan Ni, San Jose, CA (US); Ken Qi-Jin Li, Irvine, CA (US); Abraham C. Ma, Fremont, CA (US); Ming-Shiang Shen, Taipei Hsien (TW)

(73) Assignee: Super Tatent Electronics, Inc., San Jose, CA (US)

( * ) Notice: Subject to any disclaimer, the term of this patent is extended or adjusted under 35 U.S.C. 154(b) by 796 days.

This patent is subject to a terminal disclaimer.

(21) Appl. No.: 11/693,464

(22) Filed: Mar. 29, 2007

(65) Prior Publication Data

US 2007/0180264 A1    Aug. 2, 2007

Related U.S. Application Data

(63) Continuation-in-part of application No. 11/683,292, filed on Mar. 7, 2007, now Pat. No. 7,576,990, and a continuation-in-part of application No. 11/309,843, filed on Oct. 11, 2006, now Pat. No. 7,649,742, and a continuation-in-part of application No. 10/990,887, filed on Nov. 16, 2004, now Pat. No. 7,301,776, and a continuation-in-part of application No. 09/478,720, filed on Jan. 6, 2000, now Pat. No. 7,257,714.

(51) Int. Cl.
    *H05K 1/14*    (2006.01)
(52) U.S. Cl. .................................... 361/737; 361/730
(58) Field of Classification Search ............... 361/727, 361/737, 752, 790, 797, 800
    See application file for complete search history.

(56) References Cited

U.S. PATENT DOCUMENTS

| 6,493,233 | B1 | 12/2002 | De Lorenzo et al. |
| 7,034,223 | B2 | 4/2006 | Fan et al. |
| 7,113,392 | B2 | 9/2006 | Lu et al. |
| 7,576,990 | B2* | 8/2009 | Ni et al. ................. 361/737 |
| 2005/0164532 | A1 | 7/2005 | Ni et al. |
| 2006/0041783 | A1 | 2/2006 | Rabinovitz |
| 2006/0228910 | A1 | 10/2006 | Nishizawa et al. |

* cited by examiner

*Primary Examiner*—Hung S Bui
(74) *Attorney, Agent, or Firm*—Stuart T. Auvinen; gPatent LLC

(57) ABSTRACT

A case-grounded flash-memory drive has a printed-circuit board assembly (PCBA) with flash-memory chips and a controller chip. The PCBA is encased inside an upper case and a lower case, with a Serial AT-Attachment (SATA) connector that fits through an opening between the cases. The cases can be assembled with the PCBA by a screw-together or thermal-bond adhesive method. Triple-axis case-grounding tabs draw any electro-static-discharges (ESD) current off the upper case along a primary axis and onto a PCBA ground through a secondary axis that is screwed into the PCBA. An intermediary axis between the primary and secondary axes fits around a PCBA notch while the secondary axis passes through a metalized alignment hole on the PCBA for grounding. When the SATA connector is inserted into a host, the host ground sinks ESD currents collected by the triple-axis case-grounding tabs.

23 Claims, 15 Drawing Sheets

SINGLE-PCBA, SCREW-TOGETHER METHOD
FIG. 2B
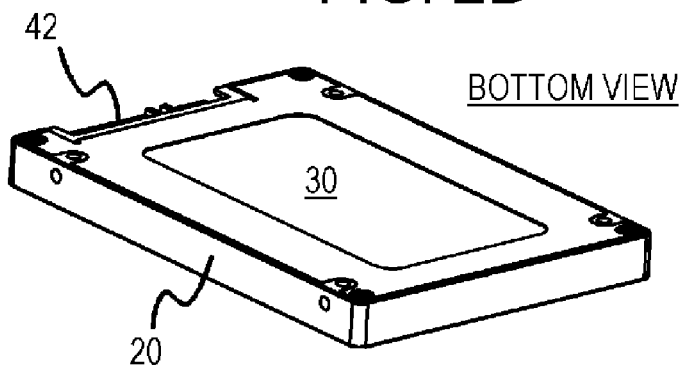
BOTTOM VIEW
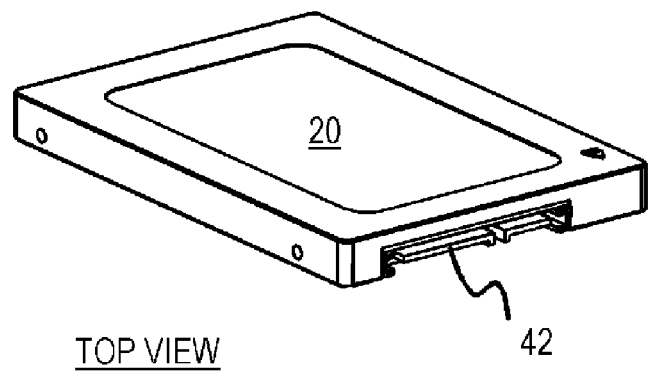
TOP VIEW
FIG. 2C

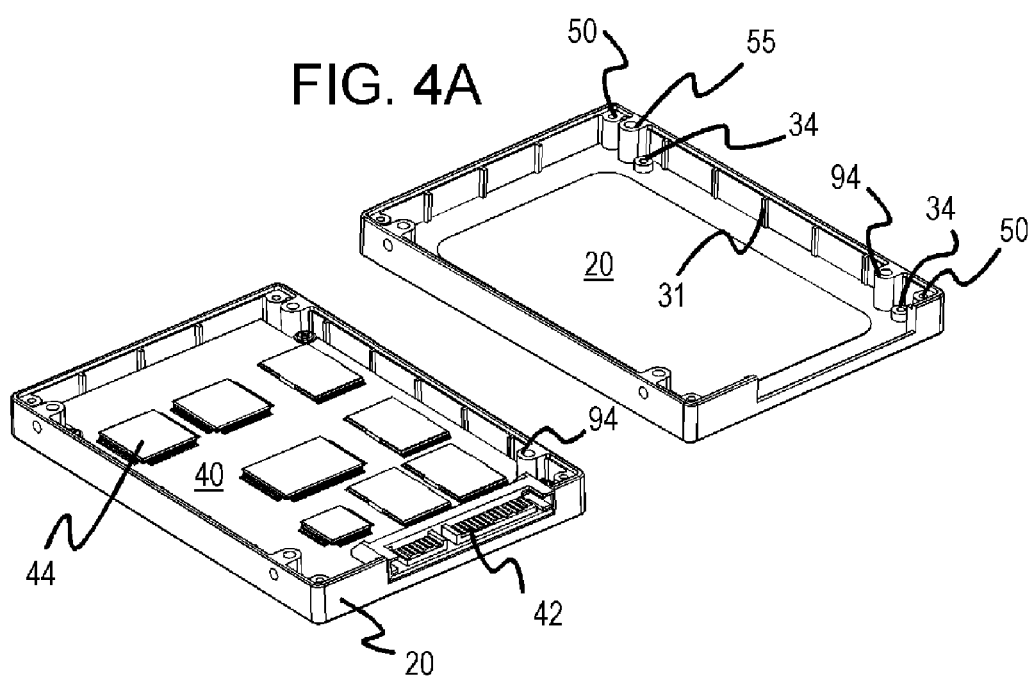

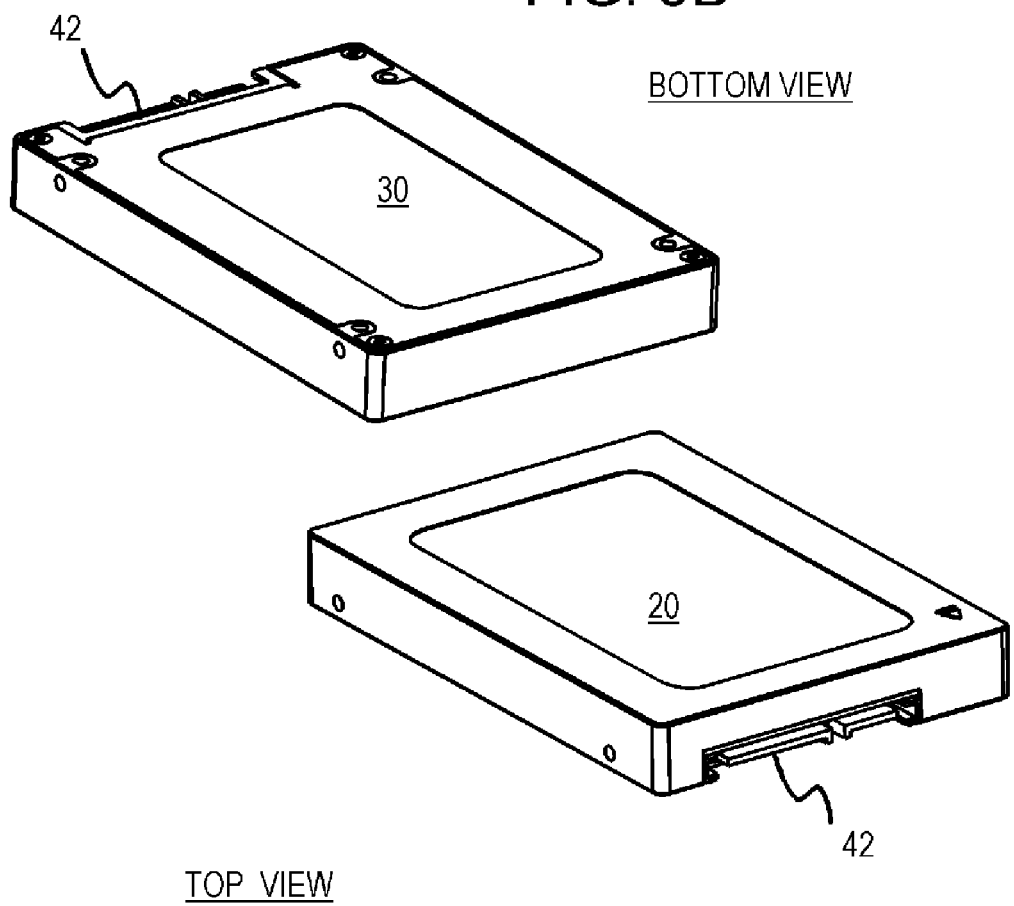

STACKED-PCBA'S

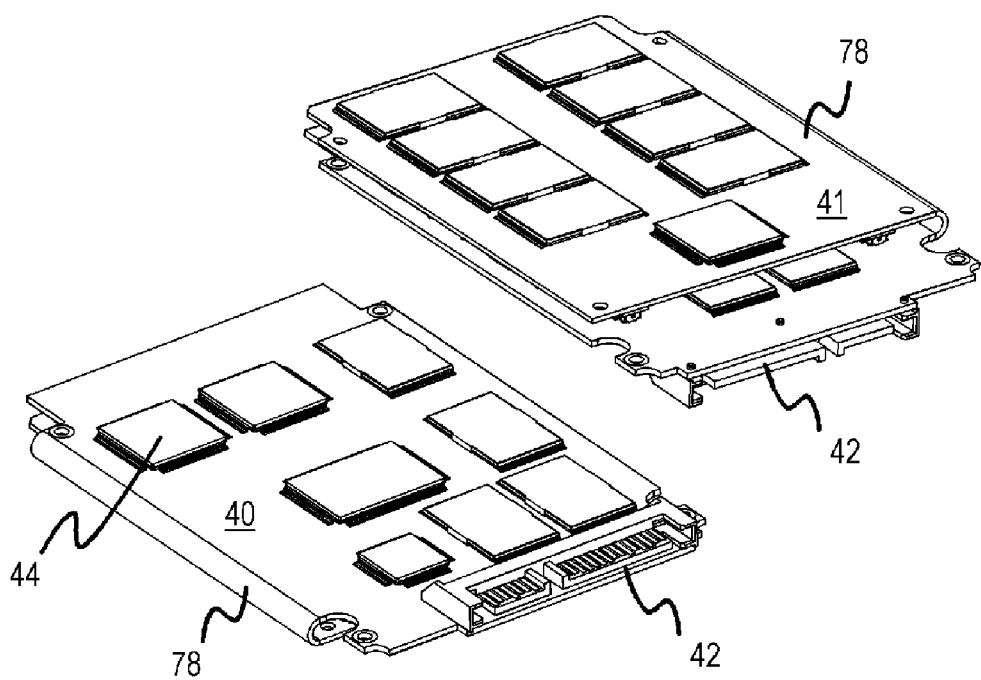
BOTTOM VIEW FIG. 7B
FIG. 7C TOP VIEW

SINGLE-PCBA, THERMAL-BOND FILM METHOD

SINGLE-PCBA,THERMAL-BONDFILM METHOD

BOTTOM VIEW

TOP VIEW

US 7,768,789 B2

HARD DRIVE WITH METAL CASING AND GROUND PIN STANDOFF TO REDUCE ESD DAMAGE TO STACKED PCBA'S

RELATED APPLICATION

This application is a continuation-in-part (CIP) of the applications for "Thin Hard Drive with 2-Piece Casing and Ground Pin Standoff to reduce ESD Damage to Stacked PCBA's", U.S. Ser. No. 11/683,292, filed Mar. 7, 2007, now U.S. Pat. No. 7,576,990, "Thin Flash-Hard-Drive with Two-Piece Casing", U.S. Ser. No. 11/309,843, filed Oct. 11, 2006, now U.S. Pat. No. 7,649,742, "Light-Weight Flash Hard Drive With Plastic Frame", U.S. Ser. No. 10/990,887, filed Nov. 16, 2004, now U.S. Pat. No. 7,301,776, and "Electronic Data Storage Medium with Fingerprint Verification Capability", U.S. Ser. No. 09/478,720, filed Jan. 6, 2000, now U.S. Pat. No. 7,257,714. This patent is also related to "Stacking Memory Chips using Flat Lead-Frame with Breakaway Insertion Pins and Pin-to-Pin Bridges", U.S. Pat. No. 6,933,209, dated Aug. 23, 2005.

FIELD OF THE INVENTION

This invention relates to flash-memory hard drives, and more particularly to manufacturing a flash drive with a two-piece metal casing, grounded standoff, and dual printed-circuit boards (PCBs).

BACKGROUND OF THE INVENTION

Solid-state flash-disk devices use flash memory for storage rather than rotating disks. Eliminating the rotating disks and mechanical devices greatly improves reliability and shock resistance. However, these solid-state devices may be more prone to damage from tiny electrical shocks or electro-static-discharge (ESD).

Flash memory chips use electrically-erasable programmable read-only memory cells (EEPROM) that can only be read or written in blocks. The blocks are typically 512 bytes or larger. In contrast to block-addressable flash memory, static random-access memory (SRAM) and dynamic-random-access memory (DRAM) are usually byte-addressable or word-addressable, where words are 4 or 8 bytes.

The parent applications disclosed an electronic data storage medium that had fingerprint verification capability. FIG. 1 is a schematic circuit block diagram illustrating an electronic data storage medium disclosed in the parent application.

The electronic data storage medium with fingerprint verification capability can be accessed by external computer 9 using input/output interface circuit 5, which may use a Personal-Computer Memory Card International Association (PCMCIA), RS-232, or similar interface to communicate. The electronic data storage medium can be located inside or outside of the external computer.

The electronic data storage medium with fingerprint verification capability is packaged in card body 1, and includes processing unit 2, memory device 3, fingerprint sensor 4, input/output interface circuit 5, display unit 6, power source 7, and function key set 8.

Memory device 3 can be a flash memory device that stores data files. Fingerprint sensor 4 scans a fingerprint of a user to generate fingerprint scan data. Processing unit 2 connects to other components and can operate in various modes, such as a programming mode, a data retrieving mode, and a data resetting mode. Power source 7 supplies electrical power to processing unit 2. Function key set 8 allows the user to input a password that is verified by processing unit 2. Display unit 6 shows the operating status of the electronic data storage medium.

The electronic data storage medium may be a subset of the electronic data storage medium with fingerprint verification capability. The electronic data storage medium is packaged in card body 1, and includes processing unit 2, memory device 3, and input/output interface circuit 5. While such an electronic data storage medium is useful, manufacturing methods and product designs are desired that can be cost-effectively produced. In particular, designs for making the card body or casing that encapsulates the electronic components are desired. To reduce the cost and size, designs of the electronic data storage medium that eliminate some costly components, such as the fingerprint sensor, function key set, and display, are desirable. An external power source may further reduce costs and size. Such device designs can allow a low-cost electronic data storage medium to be manufactured.

While metal casings are inexpensive to manufacture, metal casings are more rugged and sturdy. Metal casings also conduct ESD currents from human touch. Grounding of these metal casings is especially useful.

What is desired is a solid-state flash-drive device that has improved electro-static-discharge (ESD) protection. A grounded metal-encased flash-drive is desired.

BRIEF DESCRIPTION OF THE DRAWINGS

FIG. 2B shows a bottom view of the finished flash drive made with the screw-together process.

FIG. 2C shows a top view of the finished flash drive made with the screw-together process.

FIGS. 4A-D show enlargement views of the triple-axis case-grounding tabs formed in the upper case.

FIGS. 5A-C show a flash-drive device made with screw-together process that has two PCBA's and triple-axis case-grounding tabs.

FIGS. 7B-C shown flexible circuit boards used to form and connect dual PCBAs.

DETAILED DESCRIPTION

The present invention relates to an improvement in manufacturing ESD-hardened flash-drive devices. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that while flash drives are more reliable than rotating hard disks, flash drives may suffer from reliability problems from electro-static-discharges (ESD). Especially as integrated circuit (IC) feature sizes continue to shrink to produce higher memory densities, the susceptibility to ESD damage increases.

The inventors further realize that ESD susceptibility can be reduced by improved design and manufacturing methods. ESD damage can occur when a user touches the case when the device is plugged into a host, especially when the device has a metal case. Grounding the metal case to the ground on the device can allow ESD currents to be dissipated through the ground and be directed away from the leads to sensitive IC devices such as flash-memory chips and controllers.

Grounding is problematic with plastic-encased flash drives, since there is little or no metal in the case to ground the PCB to. Metal cases can more readily be grounded. The inventors add a case-grounding tab between the two halves of the metal case and a PCB-grounding tab between the metal case and the PCB to sink small ESD currents applied to the metal case by a user. When the flash-drive device is plugged into a host, the ESD currents applied to the metal case can be shunted through the case-grounding tab and tab to the PCB ground, and then through a connector to the host and the host's chassis ground.

The case-grounding tab is on a primary axis which most of the metal for grounding is centered around, while the PCB-grounding tab is on a secondary axis that is screwed to the PCB to make electrical contact to the PSB ground. Between the primary and secondary axis is an alignment tab on an intermediary axis.

The metal around the primary and intermediary axis acts as additional ground metal, increasing the ground capacitance, and able to sink small ESD currents that might otherwise damage IC's on the PCB. The secondary axis makes electrical connection to the PCB ground. Since the primary axis and intermediary axis are both offset from the secondary axis, a larger piece of metal may be provided around the primary axis, increasing the size of the metal ground sink and increasing its effectiveness.

Figure 2A:
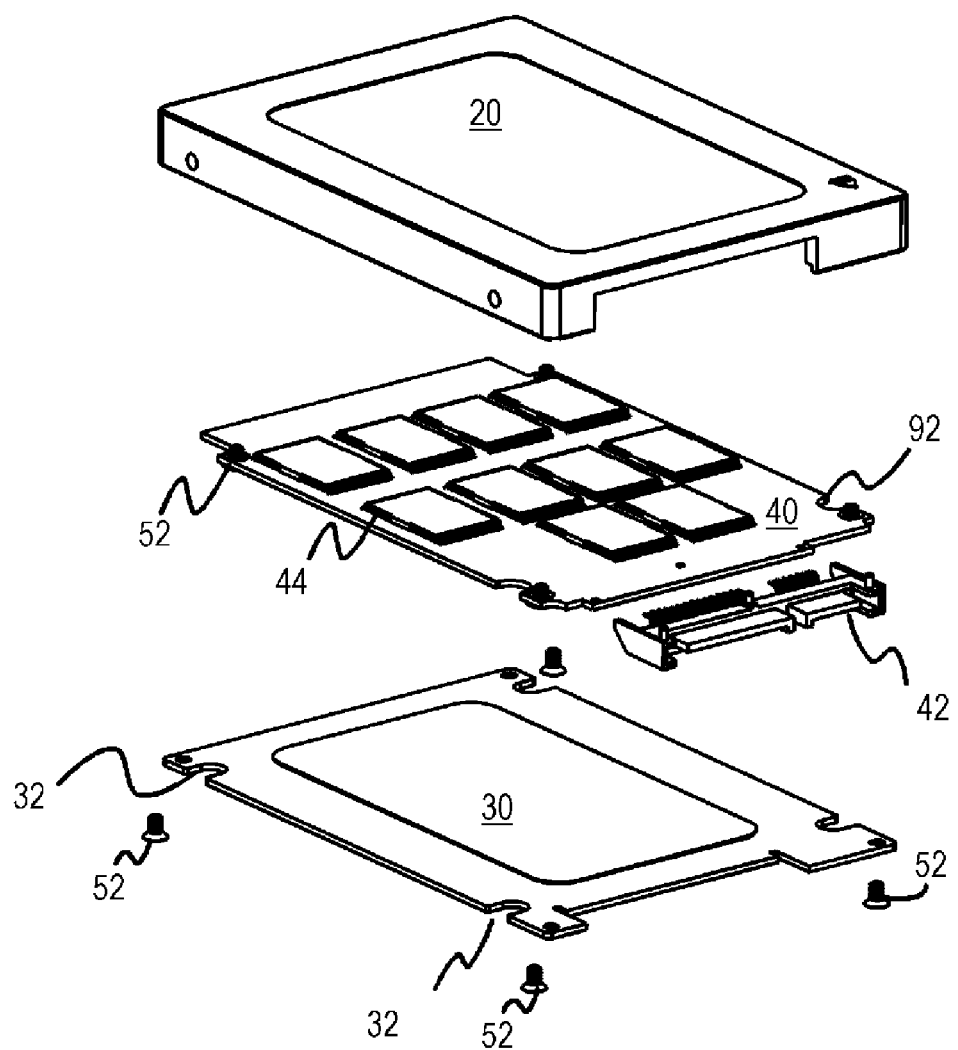
FIG. 2A is a parts view of a flash drive with case-grounding tabs.

FIG. 2A is a parts view of a flash drive with case-grounding tabs. Printed-circuit board assembly PCBA 40 is a circuit board that has chips 44 and other components such as capacitors and resistors mounted on one or both sides. Chips 44 include flash-memory chips and a controller chip. However, a flash-memory chip can be a single chip or stacked chips such as described in U.S. Pat. No. 6,933,209. Connector 42 is soldered to metal pads on PCBA 40 to form a sub-assembly. Connector 42 is a Serial AT-Attachment (SATA) connector that can connect to a personal computer (PC) or other host.

Upper case 20 and lower case 30 are formed of metal, such as by molding, stamping, or other processes. Four screws 52 fit into four corner holes in lower case 30 and then into the case-grounding tabs formed at the corners of upper case 20 on the four primary axes.

Four cutouts 32 in lower case 30 near the corners fit around alignment tabs that are also formed in upper case 20. Notches 92 in PCBA 40 also fit around these alignment tabs. Before screwing cases 20, 30 together, PCBA is fitted into upper case 20 and fits against alignment tabs and on metal standoff pedestals formed inside upper case 20. The metal standoff pedestals are on the secondary axes.

The secondary axis is aligned with the screw holes of PCBA 40 after PCBA 40 is fitted inside upper case 20, and the case-grounding tab along the primary axis of the triple-axis case-grounding tabs is formed inside upper case 30.

Four screws 52 are fitted into screw holes in PCBA 40 and then into metal standoff pedestals inside upper case 20 along the secondary axis. All four screws 52 are screwed through PCBA 40 and into screw holes that are formed inside upper case 20. The screw holes are in the middle of metal standoff pedestals inside upper case 20. Notches 92 near the front alignment holes in PCBA 40 can fit around taller metal alignment tabs formed inside upper case 20 next to the metal standoff pedestals that screws 52 fit into. Finally lower case 30 is fitted into upper case 20 and screwed with another four screws 52 into screw holes formed in four case-grounding tabs in the corners of upper case 20 to encapsulate PCBA 40.

FIG. 2B shows a bottom view of the finished flash drive made with the screw-together process. Bottom case 30 is visible inside upper case 20, with connector 42 protruding out the front of the device.

FIG. 2C shows a top view of the finished flash drive made with the screw-together process. Upper case 20 surrounds bottom case 30, which is not visible. Connector 42 protrudes out the front of the device.

Figures 3A, 3B:
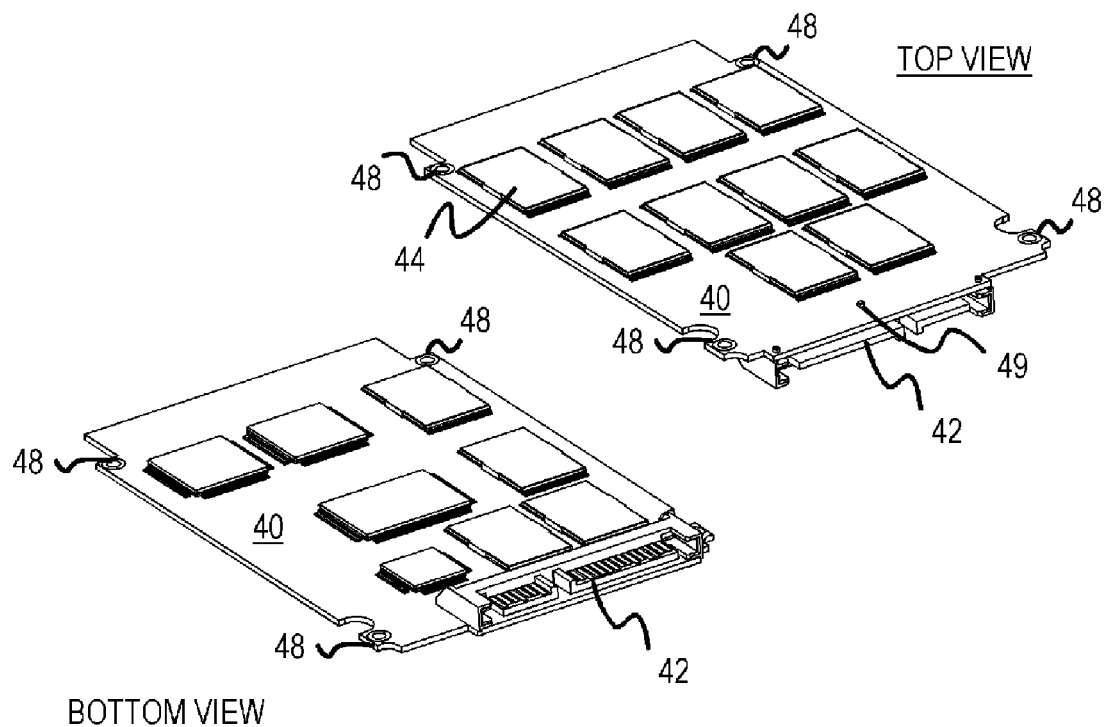
FIG. 3A shows a top view and FIG. 3B shows a bottom view of a printed-circuit board assembly (PCBA).

FIG. 3A shows a top view and FIG. 3B shows a bottom view of a printed-circuit board assembly (PCBA). PCBA 40 is a printed circuit board that has chips 44 mounted on both sides. Chips 44 include several flash-memory chips and one or more controller chips or interface chips. Near the four corners of PCBA 40 are alignment holes 48 that are surrounded by a trace ring of metal that is connected by traces or vias to the ground of PCBA 40. When screws 52 (FIG. 2A) are placed over alignment holes 48, they make electrical contact with the metal trace rings and electrically connect to the PCBA ground.

Connector 42 has metal pads (not shown) that are soldered to matching metal trace pads on PCBA 40 to make electrical connection for the SATA interface to the host. Plastic alignment tabs or pins formed in connector 42 fit into one or more connector alignment holes 49 formed in PCBA 40 during sub-assembly.

Figure 4C:
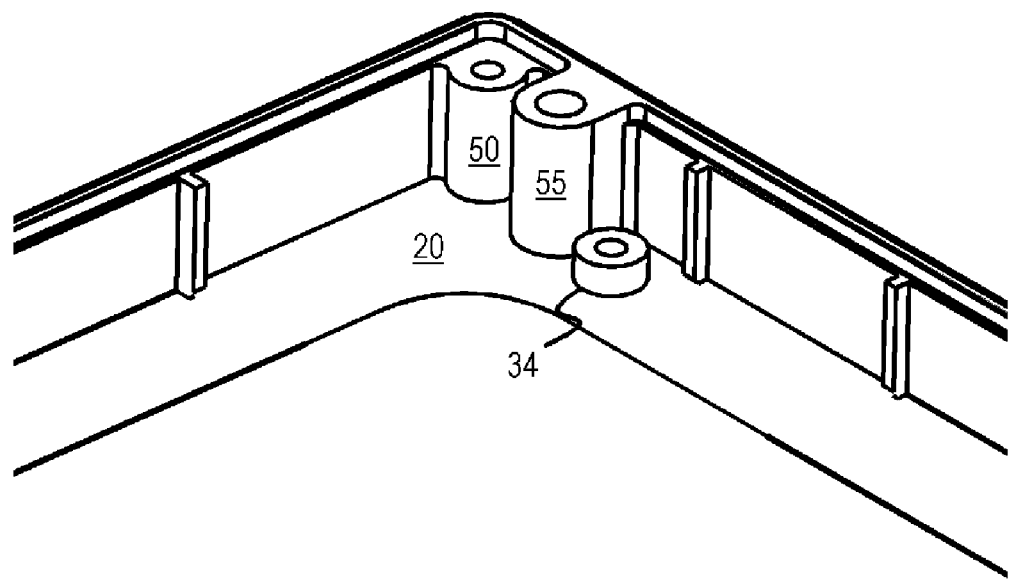

FIGS. 4A-D show enlargement views of the triple-axis case-grounding tabs formed in the upper case. In FIG. 4A, ribs 31 formed inside upper case 20 strengthen the sidewalls of upper case 20. When PCBA 40 is fitted into upper case 20, the lower surface of PCBA 40 rests on top of four metal standoff pedestals 34 that are located next to alignment tabs 55, 94. At the four corners of upper case 20 are case-grounding tabs 50 that lower case 30 is screwed into. Metal standoff pedestals 34, alignment tabs 55, 94, and case-grounding tab 50 form the triple-axis case-grounding tabs 50.

PCBA 40 has corner notches or cutouts on all four corners. The back two notches fit around two rear alignment tabs 55, while the front two notches fit around two alignment tabs 94 that are formed in upper case 20. Thus the position of PCBA 40 within upper case 20 is aligned by circuit-board notches that fit around two front alignment tabs 94 and around two rear alignment tabs 55. PCBA 40 is slid about one-half to three-fourths of the way down alignment tabs 55, 94. In the front, metal standoff pedestals 34 are between case-grounding tab 50 and alignment tab 94, while in the rear alignment tab 94 is between metal standoff pedestals 34 and case-grounding tab 50. FIG. 4B shows PCBA 40 installed inside upper case 20.

FIG. 4C shows a greater enlargement of one set of triple-axis case-grounding tabs. The triple-axis case-grounding tabs have a primary axis that is vertically oriented in FIG. 4C.

Case-grounding tab 50 is formed on the corner of upper case 20. The primary axis fits through the center of case-grounding tab 50.

Figure 4D:
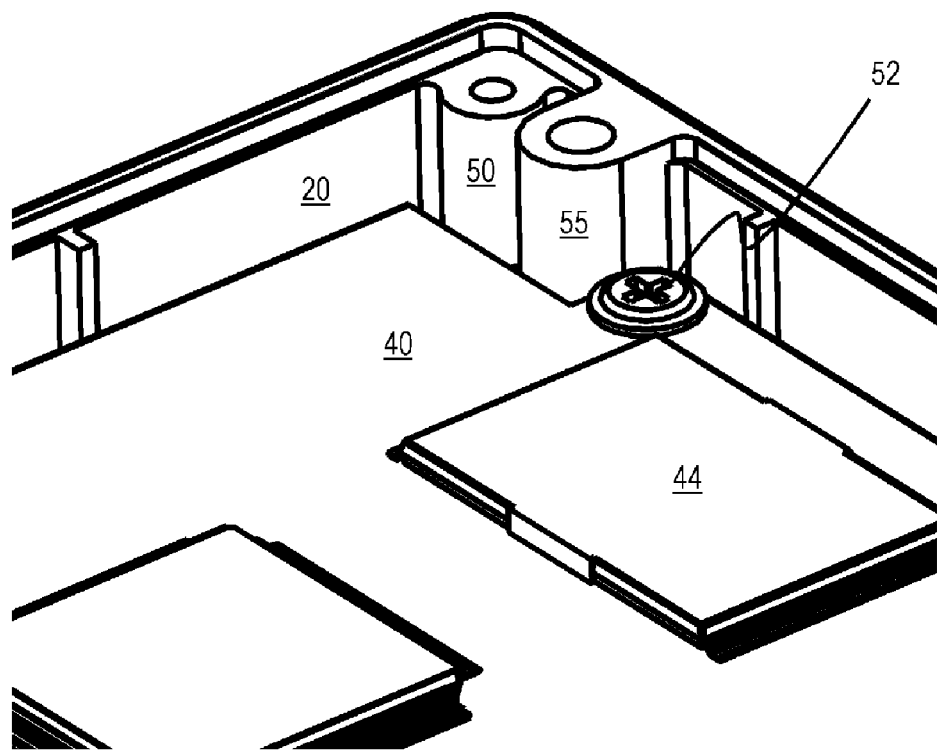

The secondary axis of the triple-axis case-grounding tabs is parallel to the primary axis, and is also vertical in FIG. 4C. The secondary axis passes through the center of metal standoff pedestal 34. The height of metal standoff pedestal 34 is reduced compared with case-grounding tab 50 and alignment tab 55 since PCBA 40 is fitted on top of metal standoff pedestal 34. The cutout or notch in PCBA 40 allows alignment tab 55 on the intermediary axis to pass through PCBA 40. Thus PCBA 40 fits above metal standoff pedestal 34 in FIG. 4C, as shown in FIG. 4D.

Screw 52 is fitted into an alignment hole in PCBA 40 and into a hole in the top of metal standoff pedestal 34 along the secondary axis. Screw 52 is screwed down through alignment hole 48 (FIG. 3A) in PCBA 40 and into metal standoff pedestal 34. Screw 52 tightens against metal traces around alignment holes 48 on PCBA 40 and against metal standoff pedestals 34 in upper case 20. FIG. 4D shows the assembly after PCBA 40 has been screwed into upper case 20. Another screw 52 fits into corner holes on lower case 30 and into the hole on the top of case-grounding tab 50 when lower case 30 is screwed onto lower case 20.

Since there is a metal trace ring around alignment holes 48 on PCBA 40 that is connected by traces or vias to the ground on PCBA 40, metal standoff pedestal 34 is grounded when screwed to PCBA 40. Traces on PCBA 40 connect the internal ground to a ground pin on connector 42, so that when the flash-drive device is inserted into a host connector, connector 42 connects the ground on PCBA 40 to the host ground. Metal standoff pedestals 34, alignment tabs 55, case-grounding tabs 50, and upper case 20 can be made from a single molded or machined piece of conducting metal, such as a copper alloy, aluminum alloy, al-cu alloy, etc. to provide good conduction.

Electric shocks applied by a user when handling upper case 20 or lower case 30 are transmitted through the triple-axis case-grounding tabs including case-grounding tab 50 and metal standoff pedestal 34, through trace metal around alignment hole 48 and traces on PCBA 40 to the ground of PCBA 40, then through a ground signal on connector 42 to the host ground, which may be connected to a chassis ground. Thus ESD shocks are carried away through the triple-axis case-grounding tabs to the chassis ground, protecting chips 44 on PCBA 40.

Figure 5A:
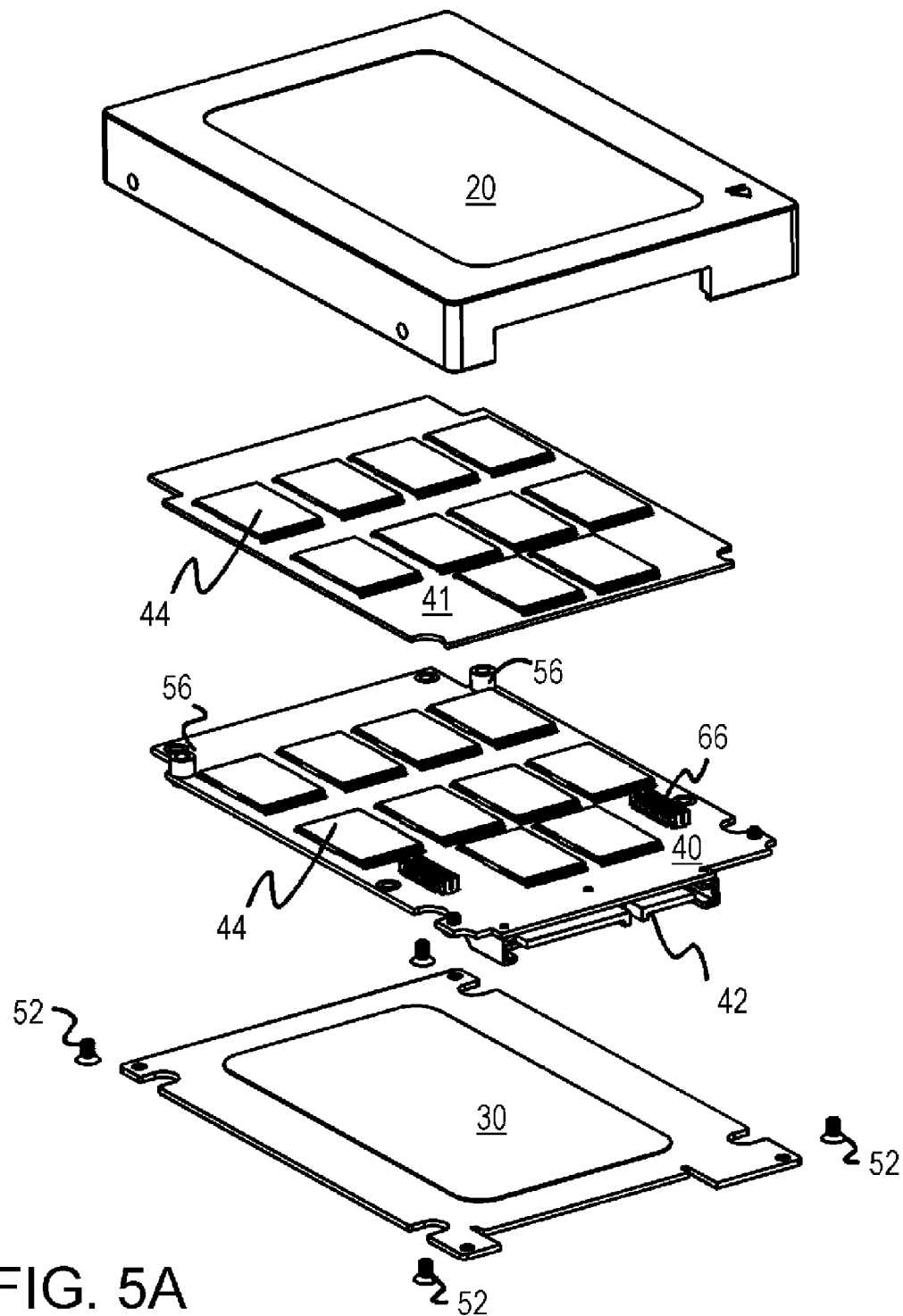

FIGS. 5A-C show a flash-drive device made with screw-together process that has two PCBA's and triple-axis case-grounding tabs. Rather than have a single PCB, two circuit boards may be placed in parallel inside the flash-drive device to increase the memory capacity or functionality.

Second or upper PCBA 41 has additional chips 44 mounted on it, such as additional flash-memory chips for greater memory capacity. Triple-axis case-grounding tabs 50 fit around notches on the back of both PCBA 41 and PCBA 40. Standoffs 56 fit between PCBA 40, 41 to provide sufficient spacing between the circuit boards. Standoffs 56 can be cylindrical rings of metal or metal that are aligned to the secondary axis and fit around screws 52. The length of screws 52 can be increased so that screws 52 fit through alignment holes in both of PCBA 40, 41 and into metal standoff pedestals inside upper case 20.

Two socket connectors 66 on the top surface of PCBA 40 receive matching pins on a connector (not shown) on the bottom surface of PCBA 41. Socket connectors 66 carry signals, ground, and power between PCBA 40, 41, and also provide spacing between PCBA 40, 41 near the front of the device so that only two standoffs 56 are needed at the rear, and no standoffs at the front.

Screws 52 fit into holes at the corners of lower case 30 and into case-grounding tabs 50 (not shown) in upper case 20 to connect the cases together and encapsulated PCBA 40, 41. Another four screws 52 (not shown) fit into alignment holes in lower PCBA 40 but not to upper PCBA 41. These screws 52 are then screwed into holes in metal standoff pedestals 34 (not visible) in upper case 20. This provides a more direct ground connection to connector 42, since connector 42 is soldered to lower PCBA 40 rather than upper PCBA 41.

FIGS. 5B-C show the final assembled flash-drive devices. The thickness of upper case 20 can be increased to allow room for second PCBA 41.

Figure 6A:
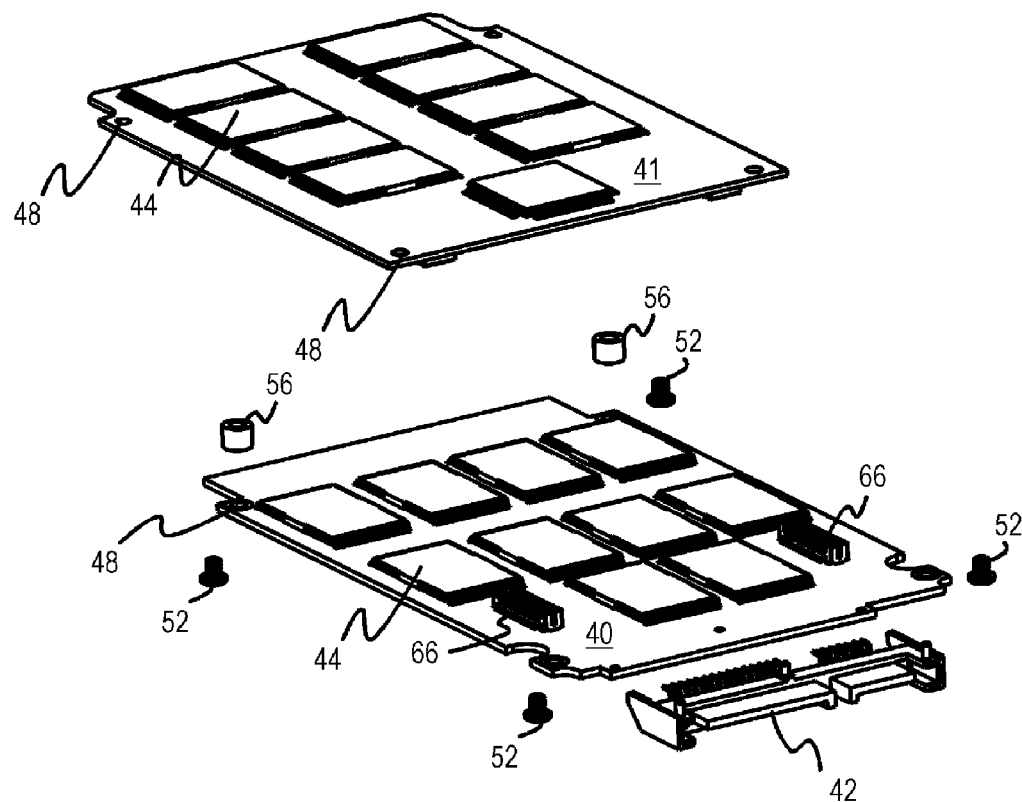
FIGS. 6A-C show dual PCBA's being assembled together before insertion into the upper case.
Figures 6B, 6C:
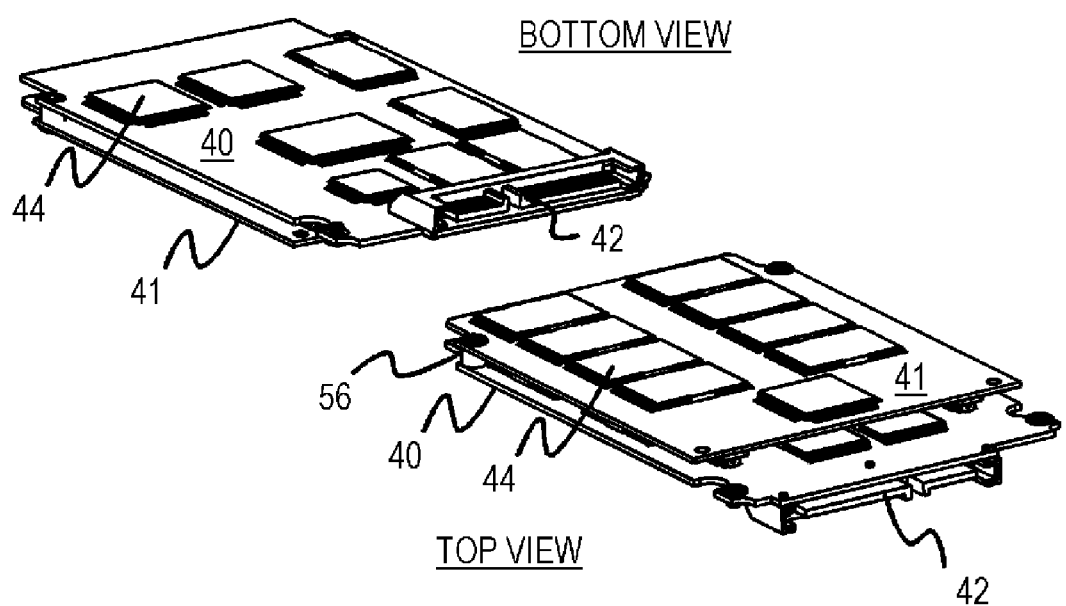

FIGS. 6A-C show dual PCBA's being assembled together before insertion into the upper case. In FIG. 6A, upper PCBA 41 and lower PCBA 40 are pre-assembled with chips 44 and other components wave-soldered onto their surfaces.

Standoffs 56 fit between PCBA 40, 41 to provide sufficient spacing between the circuit boards. Standoffs 56 can be cylindrical rings of metal or metal that are aligned to the secondary axis and fit around screws 52. The length of screws 52 can be increased so that screws 52 fit through alignment holes 48 in both of PCBA 40, 41 and into metal standoff pedestals inside upper case 20.

Two socket connectors 66 on the top surface of PCBA 40 receive matching pins on a connector (not shown) on the bottom surface of PCBA 41. Socket connectors 66 carry signals, ground, and power between PCBA 40, 41, and also provide spacing between PCBA 40, 41 near the front of the device. Connector 42 is soldered to lower PCBA 40.

PCBA 40, 41 are connected together by fitting pin connectors (not shown) on the bottom of upper PCBA 41 in socket connectors 66 on the upper surface of lower PCBA 40. Some force may be required. Standoffs 56 can then be fitted between PCBA 40, 41 over the alignment holes on the secondary axes. FIGS. 6B-C show the two PCBA's assembled together. The dual-PCBA assembly can next be fitted into upper case 20 as described earlier for the single-PCBA embodiments. The notches in the back of both PCBA 40, 41 align to allow alignment tabs 55 on upper case 20 (not shown) to fit around both of the circuit boards. Upper PCBA 41 can be shorter in the front than lower PCBA 40 to allow room for alignment tabs 94.

Figure 7A:
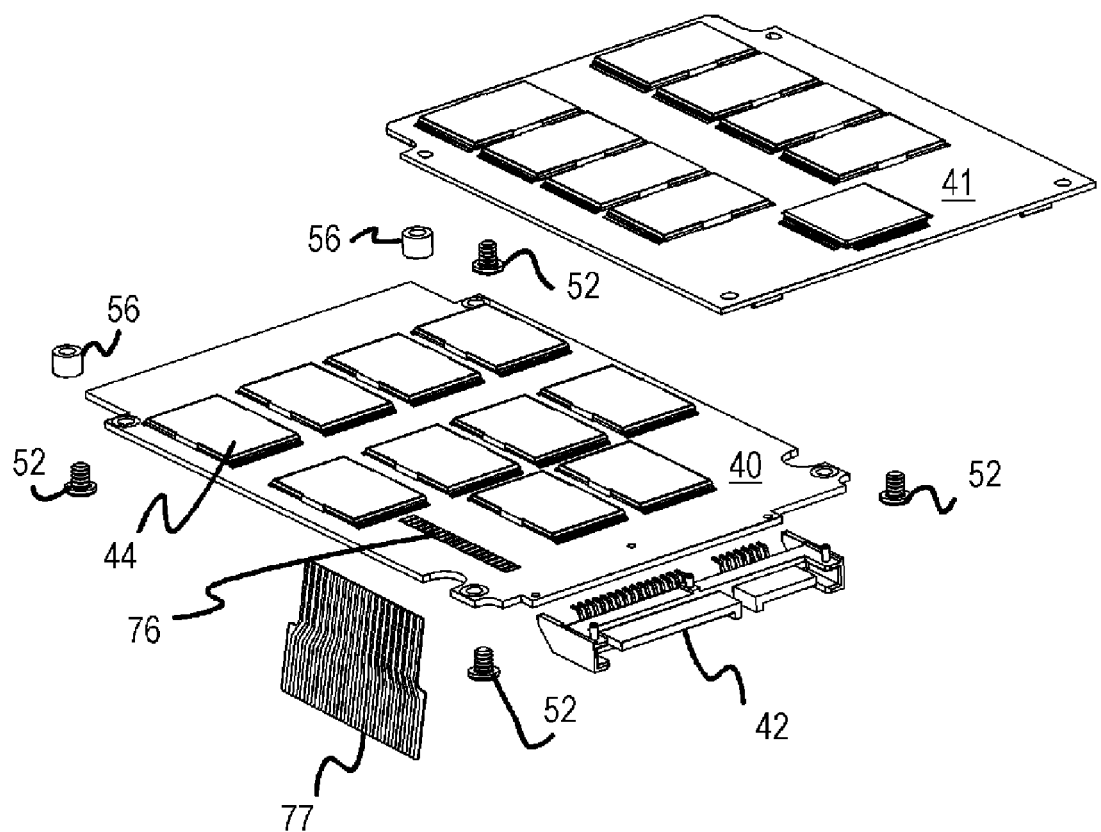
FIG. 7A shows a flexible cable connecting the dual PCBA's together.

In FIG. 7A, a flexible cable connects the dual PCBA's together. Rather than use socket connectors 66 and pins as described in FIGS. 6, flex cable 77 connects signals in upper PCBA 41 to corresponding signals in lower PCBA 40. Solder pads 76 on the surface of lower PCBA 40 connect through traces to signals in lower PCBA 40. One end of flex cable 77 is soldered to solder pads 76, while the other end of flex cable 77 is soldered to similar pads (not shown) on the bottom surface of upper PCBA 41.

Standoffs 56 can then be fitted between PCBA 40, 41 over the alignment holes on the secondary axes. Flex cable 77 can provide sufficient spacing between PCBA 40, 41 near the front of the device, near external connector 42.

In FIGS. 7B-C, flexible circuit boards are used to form and connect dual PCBAs. Flexible board material 78 is a flexible multi-layer material with signal traces formed on it. Rather than use fiberglass or other rigid material in a traditional PCB, a flexible substrate is used and circuit traces are printed or formed on the flexible substrate.

Flexible board material 78 has one end portion that forms upper PCBA 41, and another end portion that forms lower PCBA 40. Chips 44 are solder to both portions of flexible board material 78, and connector 42 is soldered to the PCBA 40 portion of flexible board material 78.

After chips 44 and connector 42 are soldered to flexible board material 78, and alignment holes 48 are punched, drilled, or otherwise formed in flexible board material 78, the two end portions of flexible board material 78 are folded together to form the dual stack sub-assembly shown in the upper and lower views of FIG. 7B-C.

Figure 8A:
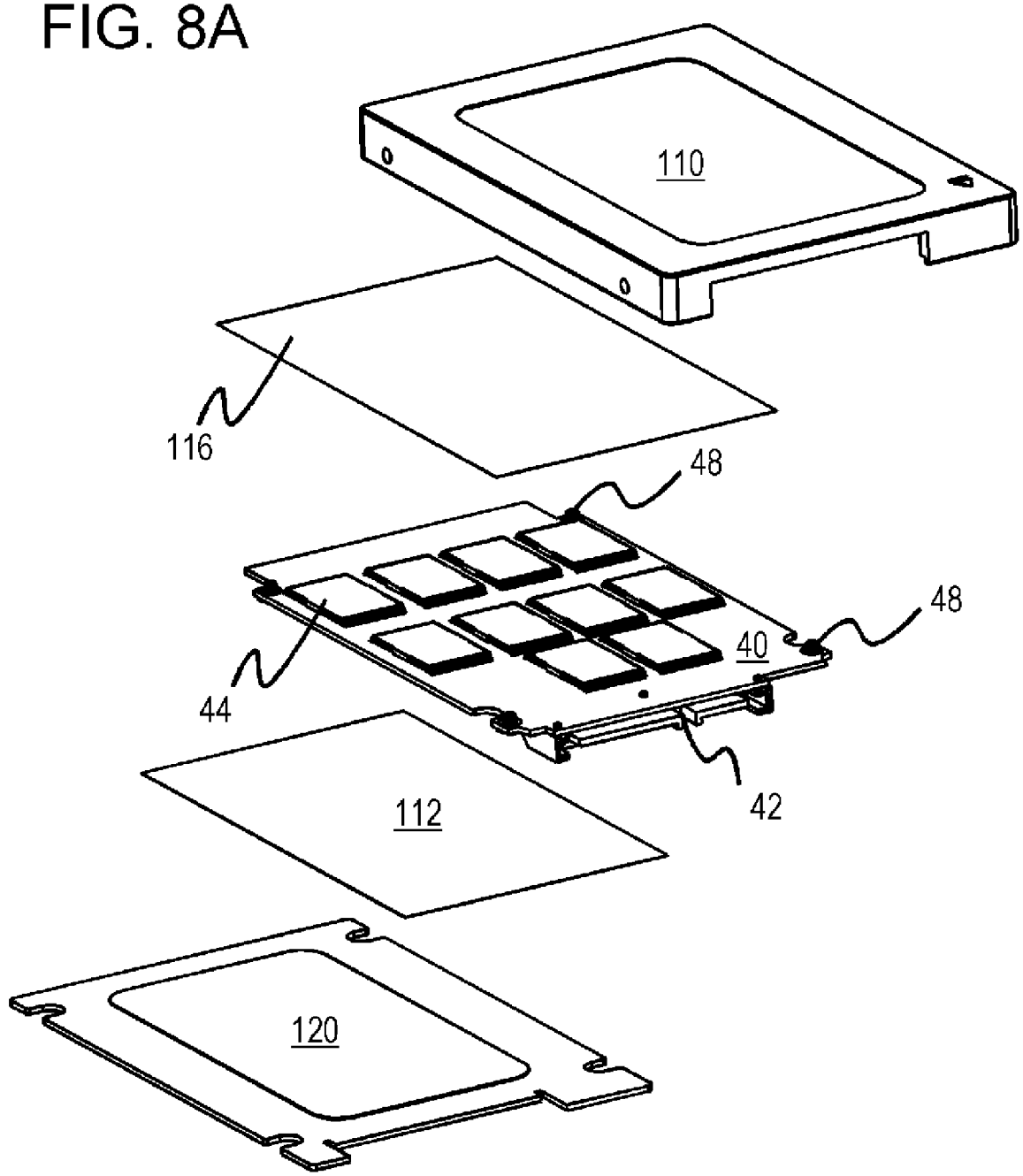
FIGS. 8A-C show a case-grounded flash-drive device made with a thermal-bond film method.
Figure 8B:
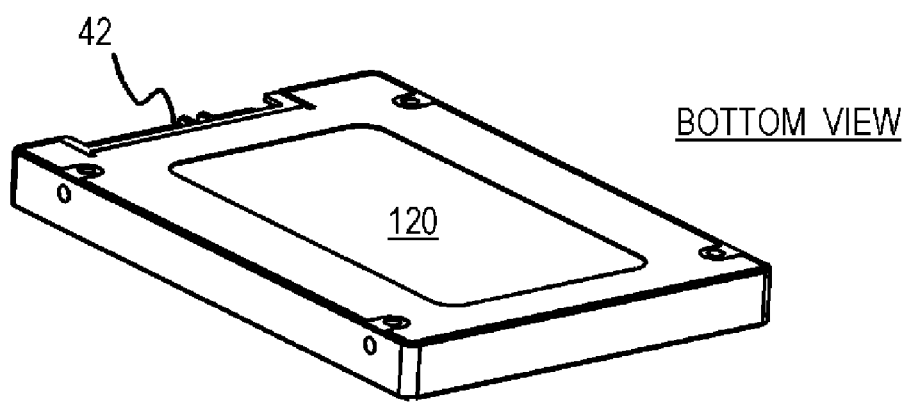
Figure 8C:
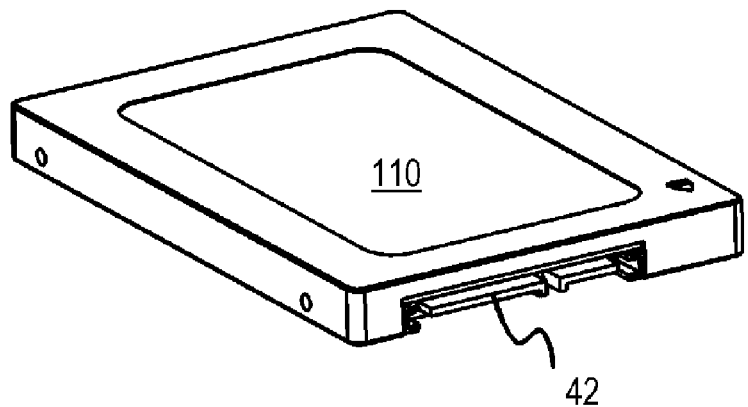

FIGS. 8A-C show a case-grounded flash-drive device made with a thermal-bond film method. Rather than use screws, contact layers of adhesive are used to secure the upper and lower cases together to enclose the PCBA. Lower adhesive film 112 bonds lower case 120 to PCBA 40, while upper adhesive film 116 bonds lower case 120 to uppercase 110.

During assembly, PCBA 40 is fitted inside upper case 110 as described earlier for upper case 20 in FIGS. 4, with screws 52 (not shown) fitting into alignment holes on PCBA 40 and into screw holes on case-grounding tabs 50 (not visible) formed inside uppercase 110.

Lower adhesive film 112 is placed inside lower case 120, and upper adhesive film 116 is fitted around the edges of upper case 110. Upper case 110 with PCBA 40 fitted and screwed inside is lowered onto lower case 120, with upper adhesive film 116 between the cases. PCBA 40 makes contact with lower adhesive film 112, such as on the tops of flash-memory chips 44, when pressed against lower case 120.

Upper adhesive film 116 and lower adhesive film 112 can be a film with a heat-activated adhesive, such as a thermal-bond film (for example, product number TBF668 produced by 3M). The adhesive is then compressed between upper case 110, lower case 120, and flash-memory chips 44, and the assembly is held in the compressed state using a fixture. The fixture is then passed through an oven maintained at a specified temperature to activate or cure the adhesive. The oven temperature can be at or lower than the maximum safe operating temperature for the memory module components.

Connector 42 can be made from a high-temperature material such as a liquid crystal polymer with 30% glass fiber filled, or nylon 66 with 20% glass fiber filled, etc.). This allows connector 42 to withstand the heating process. Thermal adhesives may allow for rework by re-heating the device and pulling apart the upper and lower cases.

FIG. 8B shows the bottom view and FIG. 8C shows the top view of the thermal-bonded flash-drive device. Edges of lower case 120 fit inside the edges of upper case 110 before screws 52 are inserted and screwed down.

Alternate Embodiments

Several other embodiments are contemplated by the inventors. For example, additional triple-axis case-grounding tabs could be added, such as an additional 2 in the middle of the device to have six triple-axis case-grounding tabs. Alternately, only two triple-axis grounding tabs could be used, or a dual-axis or single-axis tab could be added.

Rather than have cylindrical tabs for case-grounding tab 50, alignment tabs 55, and metal standoff pedestals 34, square, triangular, hexagonal, or other shaped tabs could be used. Likewise, cutouts, notches, and other forms could have other shapes. PCBA 41 may be asymmetric and may not match the outline of PCBA 40.

Additional standoffs 56 (FIG. 5) could be provided for the front screws, or the spacing may be sufficient without front standoffs. Second PCBA 41 may be shorter than PCBA 40, or may match the shape of PCBA 40.

While a connector for Serial AT-Attachment (SATA) has been described, other bus protocols and physical connectors could be substituted, such as small-computer system interface (SCSI), compact flash, integrated device electronics (IDE), and PCI Express, ExpressCard, Firewire (IEEE 1394), etc.

The upper and lower cases could be formed from only metal in some embodiments, or could include both metal and plastic. When some plastic is included, other case-connection methods could be used, such as ultrasonic bonding.

The form factor for the flash-drive device could be designed to approximate 2.5-inch hard disk drives, or a smaller form factor for 1.8-inch, 1.3-inch, 1.0-inch, or other sizes could be substituted.

Directional terms such as upper, lower, up, down, top, bottom, etc. are relative and changeable as the device is rotated, flipped over, etc. These terms are useful for describing the device but are not intended to be absolutes. Some embodiments may have chips or other components mounted on only one side of the circuit board, while other embodiments may have components mounted on both sides. In some embodiments the upper case could be smaller than the bottom case, or vice-versa.

An alternative process to the above heat-activated adhesive film is to use high viscosity adhesives. The adhesive can be applied to the case surface by manual or automatic using dispensing machine. After dispensing adhesives onto the case surface, immediately press the case against PCBA. A press fixture may be used to hold the case and PCBA in position. The curing time is about several minutes.

Various combinations of the processes may be used. For example, the adhesive films may be used with the screw-together method. Alignment sockets, tabs, or other forms may be added. Center lines or ridges may be added to stiffen the upper or lower cases. Various cosmetic features, decals, and indicia may be added.

Rather than mount packaged IC's onto the surfaces of the circuit board, unpackaged die may be mounted using die-bonding techniques. Using unpackaged die rather than packaged die may reduce the size and weight of the PCBA.

Snap-tabs with movable latching teeth or extensions or locking portions may also be used in many variations. Locking tabs and engagement slots may be used for the snaps and slots. Different thicknesses and dimensions can be substituted for the examples given. The number and arrangement of chips may vary.

Various design features such as supporting underside ribs or bumps can be added. A variety of materials may be used for the connector, circuit boards, metal pads, cases, etc. Metal cases can have a variety of shapes and may partially or fully cover different parts of the circuit board and connector, and can form part of the connector itself. Various features can have a variety of shapes and sizes. Oval, round, square, rectangular, trapezoidal, and other shapes may be used.

Rather than use the flash-drive device only for flash-memory storage, additional features may be added. For example, a music player may include a controller for playing audio from MP3 data stored in the flash memory. An audio jack may be added to the device to allow a user to plug in headphones to listen to the music. A wireless transmitter such as a BlueTooth transmitter may be added to the device to connect to wireless headphones rather than using the audio jack. Infrared transmitters such as for IrDA may also be added. A BlueTooth transceiver to a wireless mouse, PDA, keyboard, printer, digital camera, MP3 player, or other wireless device may also be added. The BlueTooth transceiver could replace the connector as the primary connector. A Bluetooth adapter device could have a connector, a RF (Radio Frequency) transceiver, a baseband controller, an antenna, a flash memory (EEPROM), a voltage regulator, a crystal, a LED (Light Emitted Diode), resistors, capacitors and inductors. These components may be mounted on the PCB before being enclosed into a plastic or metallic enclosure.

Figure 1:
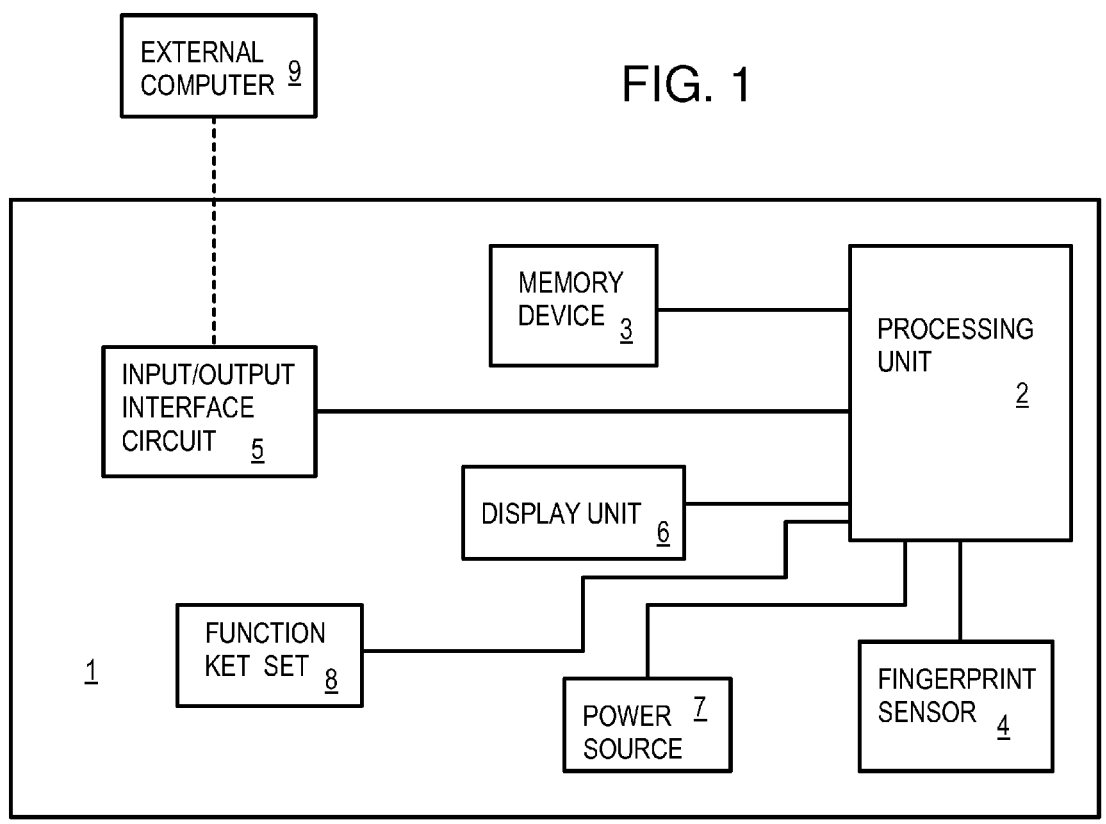
FIG. 1 is a schematic circuit block diagram illustrating an electronic data storage medium disclosed in the parent application.

A fingerprint scanner, display, keypad, power supply, or other accessories could be added to the flash-drive device with suitable changes to the casing to allow space and user access to these devices if needed. Alternately, the flash device may delete these components and just have input/output interface circuit 5, processing unit 2, and a flash memory device in the arrangement of FIG. 1. Power may be supplied through the connector. Input/output interface circuit 5 may be integrated with processing unit 2 as a controller chip.

An indicator lamp such as a light-emitting diode (LED) could be added to the PCBA. The case may have an opening, thinning of the metal, or a lens to allow light from the indicator lamp to shine through the case. A light pipe or light channel could be added.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A flash-memory drive comprising:
    an upper metal case made from metal;
    a lower metal case made from metal;
    a printed-circuit board assembly (PCBA) that comprises:
    a circuit board having wiring traces;
    a plurality of flash-memory chips mounted to the circuit board;
    a controller chip mounted to the circuit board, the controller chip having a input/output interface circuit for interfacing to an external computer, and a processing unit for accessing the plurality of flash-memory chips in response to commands from the external computer received by the input/output interface circuit; and
    a connector mounted to the circuit board, for connecting the controller chip to the external computer;
    a conductive tab that contacts the upper metal case and contacts ground traces on the circuit board, wherein the ground traces connect to a chassis ground through the connector when the connector is connected to the external computer;
    wherein the upper metal case is attached to the lower metal case during assembly with the PCBA between the upper metal case and the lower metal case, with the connector passing through an opening between the upper metal case and the lower metal case, the upper and lower metal cases encapsulating the circuit board,
    wherein the plurality of flash-memory chips are block-addressable and not randomly-addressable.

2. The flash-memory drive of claim 1 wherein the conductive tab comprises a primary axis and a secondary axis that are substantially parallel to and offset from each other and substantially perpendicular to a plane of the circuit board;
    wherein conductive tab contacts the upper metal case along the primary axis;
    wherein the conductive tab contacts the circuit board around an alignment hole that is centered about the secondary axis,
    whereby the conductive tab has primary and secondary axes.

3. The flash-memory drive of claim 2 wherein the conductive tab is integral with the upper metal case.

4. The flash-memory drive of claim 3 further comprising:
    a case-grounding tab formed on the upper metal case along the primary axis, the case-grounding tab for receiving a screw to secure the lower metal case to the upper metal case.

5. The flash-memory drive of claim 4 further comprising:
    a metal standoff pedestal formed on the upper metal case, the metal standoff pedestal formed along the secondary axis;
    wherein the metal standoff pedestal is for supporting the circuit board.

6. The flash-memory drive of claim 5 wherein the case-grounding tab is formed in corners of the upper metal case.

7. The flash-memory drive of claim 5 further comprising:
    an alignment tab formed on the upper metal case along an intermediary axis;
    wherein the intermediary axis is between the primary axis and the secondary axis for rear tabs;
    wherein the secondary axis is between the primary axis and the intermediary axis for front tabs;
    whereby the alignment tab is between the case-grounding tab and the metal standoff pedestal for rear tabs.

8. The flash-memory drive of claim 7 wherein the primary, secondary, and intermediary axes are substantially parallel to each other.

9. The flash-memory drive of claim 8 wherein the alignment tab is taller along the intermediary axis than the case-grounding tab along the primary axis in a direction perpendicular to the circuit board.

10. The flash-memory drive of claim 9 wherein the case-grounding tab and the alignment tab are taller than the metal standoff pedestal in a direction perpendicular to the circuit board.

11. The flash-memory drive of claim 7 further comprising:
    a screw fastener, inserted into the alignment hole in the circuit board, along the secondary axis and into the metal standoff pedestal, to fasten the circuit board to the conductive tab of the upper metal case during assembly,
    whereby the upper metal case, alignment hole, and metal standoff pedestal are screwed together along the secondary axis.

12. The flash-memory drive of claim 11 further comprising:
    a case screw fastener that is inserted through the lower metal case into the case-grounding tab of the upper metal case along the primary axis,
    whereby the upper metal case and lower metal case are screwed together.

13. The flash-memory drive of claim 7 further comprising:
an upper adhesive film disposed between the lower metal case and the upper metal case during assembly;
a lower adhesive film disposed between the PCBA and the lower metal case during assembly;
whereby the lower adhesive film bonds the lower metal case to the PCBA and the upper adhesive film bonds the lower metal case to the upper metal case during assembly.

14. The flash-memory drive of claim 13 wherein the upper adhesive film and the lower adhesive film are thermally activated by an elevated temperature.

15. The flash-memory drive of claim 2 further comprising:
a second circuit board that is substantially parallel to the circuit board;
standoffs between the circuit board and the second circuit board,
wherein a second plurality of flash-memory chips are mounted to the second circuit board,
whereby a stack of circuit boards are encapsulated by the upper metal case and the lower metal case.

16. The flash-memory drive of claim 15 wherein the standoffs are along the secondary axis.

17. The flash-memory drive of claim 15 further comprising:
a first connector on the circuit board that mates with a second connector on the second circuit board.

18. The flash-memory drive of claim 15 further comprising:
a flex cable between the circuit board and the second circuit board.

19. The flash-memory drive of claim 15 wherein the circuit board is formed from a first portion of a flexible substrate;
wherein the second circuit board is formed from a second portion of a flexible substrate;
wherein the flexible substrate is folded between the first portion and the second portion to form the stack of circuit boards.

20. The flash-memory drive of claim 2 wherein the connector is an integrated device electronics (IDE) connector or a small-computer system interface (SCSI) connector or a Serial AT-Attachment (SATA) connector, or a compact flash, PCI Express, ExpressCard, or Firewire (IEEE 1394) connector.

21. A method for manufacturing a flash-memory device comprising:
soldering flash-memory chips onto both surfaces of a printed-circuit board (PCB) and soldering a controller chip to the PCB;
forming a PCB assembly by soldering a connector to an edge of the PCB, the connector for carrying signals from an external computer to the controller chip to instruct the controller chip to read blocks of data from the flash-memory chips;
forming an upper case from metal;
forming a plurality of triple-axis case-grounding tabs that each include a case-grounding tab, an alignment tab, and a metal standoff pedestal, wherein the triple-axis case-grounding tabs are formed on the upper case when forming the upper case;
forming a lower case from metal;
fitting the PCB assembly into the upper case wherein an alignment hole on the PCB assembly is aligned over the metal standoff pedestal and wherein a notch on the PCB assembly fits around the alignment tab;
for each of the triple-axis case-grounding tabs, screwing a screw along a secondary axis into the alignment hole and into the metal standoff pedestal to secure the PCB to the upper case to make electrical connection from the triple-axis case-grounding tabs through the alignment holes to a ground of the PCB to form a sub-assembly of the PCB assembly and the upper case;
for each of the triple-axis case-grounding tabs, screwing a case screw along a primary axis through the lower metal case and into the case-grounding tab to secure the lower case to the upper case and to encapsulate the PCB assembly,
whereby the flash-memory device is assembled with triple-axis case-grounding tabs.

22. The method of claim 21 wherein the PCB is a flexible substrate having a first portion and a second portion;
further comprising:
folding the flexible substrate so that the first portion is substantially parallel to the second portion;
whereby the PCB is formed by folding a flexible substrate.

23. A flash-memory device comprising:
upper metal case means for partially encasing the flash-memory device with metal;
lower metal case means for partially encasing the flash-memory device with metal;
a printed-circuit board assembly (PCBA) that comprises:
circuit board means for connecting chips with wiring traces;
a plurality of flash-memory chip means for storing blocks of data, the plurality of flash-memory chip means being mounted to the circuit board means, wherein the plurality of flash-memory chip means are block-addressable and not randomly-addressable;
controller chip means, mounted to the circuit board means, for controlling access to the plurality of flash-memory chip means, the controller chip means comprising an input/output interface means for interfacing to an external computer, and processing unit means for accessing the plurality of flash-memory chip means in response to commands from the external computer received by the input/output interface means; and
connector means, mounted to the circuit board means, for connecting the controller chip means to the external computer;
triple-axis case-grounding tab means, formed on the upper metal case means, for conducting static-electric currents from the upper metal case means and the lower metal case means to the PCBA, the triple-axis case-grounding tab means contacting the upper metal case means and the lower metal case means at a primary axis, and making electrical contact to the circuit board means at a secondary axis, wherein the primary axis and the secondary axis are parallel to each other and perpendicular to a major surface of the circuit board means;
wherein the upper metal case means is attached to the lower metal case means at the primary axis during assembly with the PCBA between the upper metal case means and the lower metal case means, with the connector means passing through an opening between the upper metal case means and the lower metal case means.

* * * * *